US008417492B1

(12) United States Patent
Rasmussen et al.

(10) Patent No.: US 8,417,492 B1
(45) Date of Patent: Apr. 9, 2013

(54) SIMULATING GRANULAR MATERIAL

(75) Inventors: Nicholas Grant Rasmussen, Fairfax, CA (US); Frederick E. Hankins, Novato, CA (US)

(73) Assignee: Lucasfilm Entertainment Company Ltd., San Francisco, CA (US)

( * ) Notice: Subject to any disclaimer, the term of this patent is extended or adjusted under 35 U.S.C. 154(b) by 503 days.

(21) Appl. No.: 12/700,943

(22) Filed: Feb. 5, 2010

Related U.S. Application Data

(60) Provisional application No. 61/265,542, filed on Dec. 1, 2009.

(51) Int. Cl.
*G06G 7/48* (2006.01)
(52) U.S. Cl.
USPC ............................................................. 703/6
(58) Field of Classification Search ........................ 703/6
See application file for complete search history.

(56) References Cited

PUBLICATIONS

Onoue, Koichi et al., "An Interactive Deformation System for Granular Material", 2005, vol. 24, No. 1, The Eurographics Association and Blackwell Publishing Ltd.*
Pla-Castells, Marta et al., "Interactive Terrain Simulation and Force Distribution Models in Sand Piles", 2006, Springer-Verlag Berlin Heidelberg.*
Sumner, Robert W. et al., "Animating Sand, Mud, and Snow", 1999, Computer Graphics Forum, vol. 18, No. 1, The Eurographics Assiciation, Blackwell Publishers.*
Boateng, A.A. et al., "Modeling of Particle Mixing and Segregation in the Transverse Plane of a Rotary Kiln", Jan. 29, 1996, Elsevier Science Ltd.*
Zinchenko, Alexander Z. et al., "Algorithm for Direct Numerical Simulation of Emulsion Flow Throgh a Granular Material", May 16, 2008, Journal of Computational Physics 227, Elsevier Inc.*
Sumner et al., "Animating Sand, Mud, and Snow," *Computer Graphics Forum*, vol. 18 (1999), No. 1, 11 pages.
Onoue et al., "Virtual Sandbox," The University of Tokyo, 2003, 8 pages.

* cited by examiner

*Primary Examiner* — David Silver
*Assistant Examiner* — Cedric D Johnson
(74) *Attorney, Agent, or Firm* — Fish & Richardson P.C.

(57) ABSTRACT

A computer-implemented method for simulating a granular material includes removing, from a layer of granular material in a virtual domain defined by a data structure stored in a computer readable storage medium, a portion of the granular material in a closed region where the portion and a part of an object impacting the granular material are defined as occupying a same space. The method includes determining a value for a size aspect of the portion based on applying a numerical solver along an entirety of a boundary of the closed region. The method includes placing additional granular material along the boundary to create a shape resulting from the impact of the object. The method includes generating an image using the data structure, the image reflecting the impact of the object on the granular material in the virtual domain.

19 Claims, 6 Drawing Sheets

SIMULATING GRANULAR MATERIAL

This application claims priority from U.S. Provisional Patent Application Ser. No. 61/265,542, filed Dec. 1, 2009, and entitled "Method for simulating granular material, for example sand," the entire contents of which are incorporated herein by reference.

TECHNICAL FIELD

1. Technical Field

This document relates to simulating a granular material.

2. Background

Simulation is an area of computer graphics that places high demands on the ability to generate lifelike images, sometimes as close to an actual photograph as possible, and also to be able to do so as quickly as possible or using the least amount of system resources. A particular challenge in simulation is to generate a plausible appearance—and in animated sequences, behavior—of granular materials, for example sand or dust.

Granular materials occur in many contexts and have characteristics that vary according to the situation but also some characteristics that are common despite the exact nature of the granular material. A fine-grained material like dust or flour is going to behave differently from sand or pebbles, but they have in common that the particles making up the material are to some extent homogeneous within a range of sizes and shapes, and that the material have the ability to form stable piles, unlike a liquid material.

SUMMARY

In a first aspect, a computer-implemented method for simulating a granular material includes removing, from a layer of granular material in a virtual domain defined by a data structure stored in a computer readable storage medium, a portion of the granular material in a closed region where the portion and a part of an object impacting the granular material are defined as occupying a same space. The method includes determining a value for a size aspect of the portion based on applying a numerical solver along an entirety of a boundary of the closed region. The method includes placing additional granular material along the boundary to create a shape resulting from the impact of the object. The method includes generating an image using the data structure, the image reflecting the impact of the object on the granular material in the virtual domain.

Implementations can include any or all of the following features. The computer-implemented method further includes determining, after placing the additional granular material and before generating the image, whether the additional granular material causes additional interference with the object in the virtual domain, and if so changing a distribution of the additional granular material. An iterative process is performed until the additional interference no longer occurs. Determining the value involves using discrete height values as an approximation a continuous medium. The size aspect is used to specify a non-zero divergence that the numerical solver takes into account. The size aspect includes spatially distributed values representing heights of a height field that are to be removed to accommodate the part of the object, wherein the layer of the granular material is defined by the height field. The computer-implemented method further includes replacing a specific portion of the granular material defined by the height field with individual particles, wherein the individual particles are visible in the image. The computer-implemented method further includes setting boundary conditions outside the closed region, wherein the numerical solver uses the boundary conditions in solving a differential equation. The differential equation relates a first field which is the size aspect per unit area to a second field which is a second derivative of a potential field for the first field. The computer-implemented method further includes defining a grid of grid cells throughout the virtual domain, wherein determining the size aspect includes determining a flow of the size aspect in each of the grid cells that abuts the boundary. Each grid cell has multiple sides, and wherein in each of the grid cells the flow is determined only for any side of the grid cell that contributes to the flow. The granular material is defined in the data structure to represent at least one material selected from: sand, gravel, dirt, snow, hail, slush, earth, dust, debris, ashes, powder, flour, pebbles, saw dust, beads, salt, spice, packing peanuts, marbles, food, tablets, confetti, and combinations thereof. The computer-implemented method further includes eroding the additional granular material, after placing the additional granular material and before generating the image, in creating the shape. The image is one among multiple images generated as part of an animation showing the object in motion while impacting the granular material, wherein in others of the multiple images there are different interferences between the object and the granular material, and wherein different shapes are created in those images to reflect the impact.

In a second aspect, a computer program product tangibly embodied in a computer-readable storage medium includes instructions that when executed by a processor perform a method for simulating a granular material. The method includes removing, from a layer of granular material in a virtual domain defined by a data structure stored in a computer readable storage medium, a portion of the granular material in a closed region where the portion and a part of an object impacting the granular material are defined as occupying a same space. The method includes determining a value for a size aspect of the portion based on applying a numerical solver along an entirety of a boundary of the closed region. The method includes placing additional granular material along the boundary to create a shape resulting from the impact of the object. The method includes generating an image using the data structure, the image reflecting the impact of the object on the granular material in the virtual domain.

In a third aspect, a computer program product tangibly embodied in a computer-readable storage medium includes instructions that when executed by a processor perform a method for simulating a granular material. The method includes creating, using a computer system, a data structure that defines a virtual domain in which to perform a simulation, the data structure being stored in a computer readable storage medium. The method includes defining, in the data structure, a grid for the virtual domain, the grid comprising multiple grid cells. The method includes defining, in the data structure, a height level field in the virtual domain, the height level field including height values assigned to respective grid cells, each of the height values representing a height of a granular material at one of the grid cells, the height level field being defined such that the granular material forms a surface in at least part of the virtual domain. The method includes defining, in the data structure, an object in the virtual domain, the object representing a rigid material having an impact on the granular material, the object being positioned in the virtual domain with interference between at least part of the object and the granular material, the interference being that the part of the object is defined as occupying a same space as some of the granular material. The method includes identifying each one of the grid cells where the object interferes with the granular material, the interference grid cells forming a bounded region in the granular material. The method includes determining an interference height value for each interference grid cell based on a corresponding overlap between the surface and the object. The method includes obtaining reduced height values by subtracting each of the interference height values from the height value of the corresponding interference grid cell. The method includes replacing, in the data structure, the height value for each of the interference grid cells with the corresponding reduced height value, the replacements corresponding to eliminating the interference between the object and the surface by removing an amount of the granular material from the intersection grid cells. The method includes defining, in the data structure, a source field ρ for the virtual domain that has a source value assigned to each of the grid cells, the source values corresponding to height of the granular material removed per unit area, wherein each source value inside the bounded region is a nonzero value based on the corresponding interference height value, and each source value outside the bounded region is zero. The method includes determining a potential field ϕ for the virtual domain that has a potential value assigned to each of the grid cells, the potential field ϕ determined by numerically solving $$\nabla^2 \phi = \rho$$

for each of the grid cells, wherein $\nabla^2$ is the Laplace operator. The method includes determining a potential gradient $\nabla\phi$ of the potential field ϕ for each of the grid cells. The method includes integrating the potential gradient $\nabla\phi$ over at least each of the grid cells that is a boundary grid cell to obtain a distribution height value for each of the boundary grid cells, wherein each of the boundary grid cells (i) is a non-interference grid cell, and (ii) abuts at least one of the interference grid cells. The method includes adding, in the data structure, each distribution height value to the height value of the corresponding boundary grid cell, the addition corresponding to distributing additional granular material among all of the boundary grid cells, the additional granular material being equal in volume to the amount of the granular material removed from the interference grid cells. The method includes redistributing some of the additional granular material from the boundary grid cells to other non-interference grid cells by adjusting the height values in the data structure accordingly, the redistribution corresponding to creating a shape of the granular material resulting from the impact of the object. The method includes generating an image using the data structure, the image reflecting the impact of the object on the granular material in the virtual domain. The method includes displaying the image.

Implementations can provide any or all of the following advantages. Simulation of a granular material can be defined such that powerful solvers are applicable, and this can lead to results that are more easy to generate in parallel, and that are better suited for subsequent steps in the image generation. An impact between an object and a granular material can be simulated such that granular material is removed where there is an interference between the object and the material, and a differential equation can be solved to determine how the granular material should be redistributed elsewhere in the scene.

The details of one or more implementations are set forth in the accompanying drawings and the description below. Other features and advantages will be apparent from the description and drawings, and from the claims.

DESCRIPTION OF DRAWINGS

Like reference symbols in the various drawings indicate like elements.

DETAILED DESCRIPTION

Figure 1:
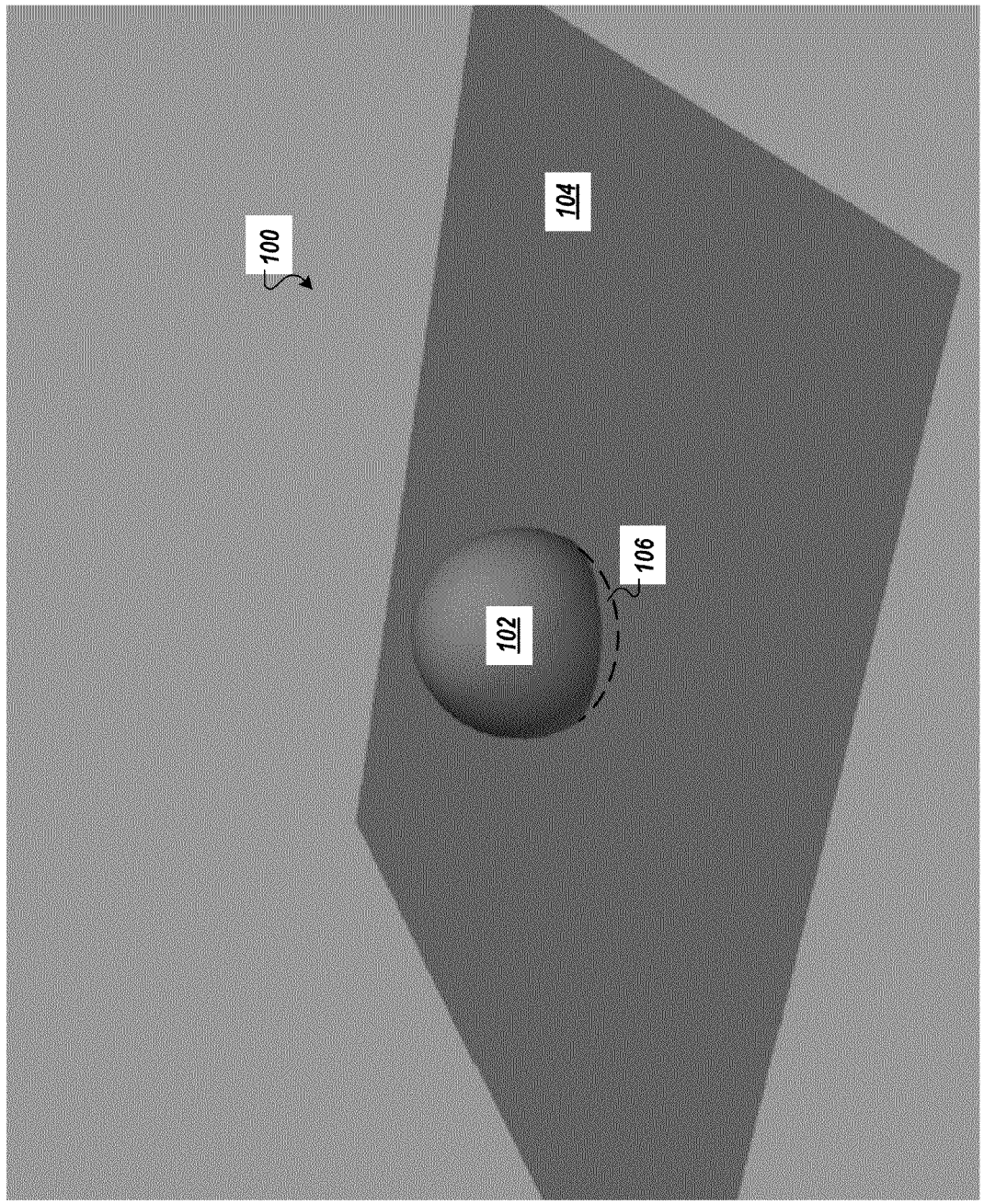
FIG. 1 shows an example of a virtual domain where a ball impacts a layer of granular material.

FIG. 1 shows an example of a virtual domain 100 where a ball 102 impacts a layer 104 of granular material. For example, assume that a computer-based simulation should be performed to illustrate a golf ball landing in a bunker and coming to rest partially embedded in the sand. For that or other simulations, the virtual domain 100 can be defined to in essence construct a virtual three-dimensional space in which the ball, the sand and any other necessary materials or elements can be modeled. In this example it will be described how the simulation of the ball impact can be advantageously performed by carefully defining the parameters of the scenario in a way that allows use of powerful numerical solution techniques, for a lifelike and plausible end result.

In this example, the ball 102 does not yet have the dimples or other surface features of a golf ball, and the layer 104 does not yet resemble a layer of sand. This is because the techniques discussed in this example are performed on computer-defined virtual objects and this simulation can occur earlier in the "pipeline" than the texturing phase where the objects are covered with suitable surfaces that give them the correct appearance. As such, it can be assumed in the present example that after successful simulation of the impact of the golf ball on the sand in the bunker, the appropriate textures will be applied and the simulation will not only show a plausible kinetic behavior of the materials involved, but will also have the ball 102 looking like a golf ball and the layer 104 looking like sand.

The simulation can be intended to show the ball impacting the sand over a finite amount of time, for example one second or less. The resulting video sequence (e.g., a motion picture) can therefore be made from a series of image frames that when displayed to a user in rapid succession give the appearance of a ball moving through the air and coming to a complete rest as it lands in the bunker. Simulation techniques described herein can be used on any or all of the images that are to become individual frames in the sequence. That is, the sequence can be planned to have a duration of about one second, and as such it can require about 24 individual frames or more, depending on the frame speed of the particular video or film format. In the following examples, then, the simulation will be described as generating only a single image, for clarity, but it is assumed that multiple images can be generated for assembly into a video sequence.

In the particular instance of the simulation that is illustrated in this example, about one-third of the ball is inside the layer 104 and the rest of the ball is above the surface. The dashed outline showing the portion of the ball inside the layer is here added for purposes of illustrating the description and may not be visible in the actual simulation. This example is defined so that the ball continues to be in motion at the moment—although a single image will always have the ball fixed in one location regardless of whether the image is part of a simulation that shows the ball in motion. Moreover, the example is defined so that the ball will penetrate somewhat further into the sand in subsequent steps of the simulation.

It is noted that the ball 102 is modeled to represent a rigid material, such as the plastic and/or other composite materials that make up modern golf balls. That the material is rigid in the simulation means that it should behave like a solid body in kinetic interactions, for example such that it has the ability to deform another material either elastically or plastically. However, in the current stage of the simulation, the ball does not exhibit rigid properties, at least not in every aspect of its interaction with the environment. Rather, when the ball 102 is placed in its current position—i.e., such that a part of the ball penetrates the layer 104—then the ball part and the corresponding section of the layer are defined as occupying the same space. This can be described in terms of there being an interference 106 between the ball and the sand. Both the ball and the granular material are currently defined as occupying the space inside the interference 106. In reality, of course, a golf ball landing in a bunker will not become one with the sand particles, but rather will displace some of the sand due to its kinetic energy, and because of friction against the sand particles the ball will quickly come to rest. For this reason, the layer 104 should be modified to displace some of the granular material such that the interference 106 is eliminated. After the interference 106 is eliminated in this example, the ball will occupy the space where the interference 106 occurred, and some of the sand will have been displaced, optionally together with some compression of the sand density, to accommodate the ball in its current position. Again, it is because the ball 102 is defined as being a rigid object and the layer 104 is defined as being a granular material, that the solution to the interference 106 is to displace part of the layer and not part of the ball.

The layer 106 can represent one or more of a variety of materials in particular implementations. For example, the layer 106 can be defined to represent at least one of sand, gravel, dirt, snow, hail, slush, earth, dust, debris, ashes, powder, flour, pebbles, saw dust, beads, salt, spice, packing peanuts, marbles, food, tablets, confetti, and combinations thereof.

Figure 2:
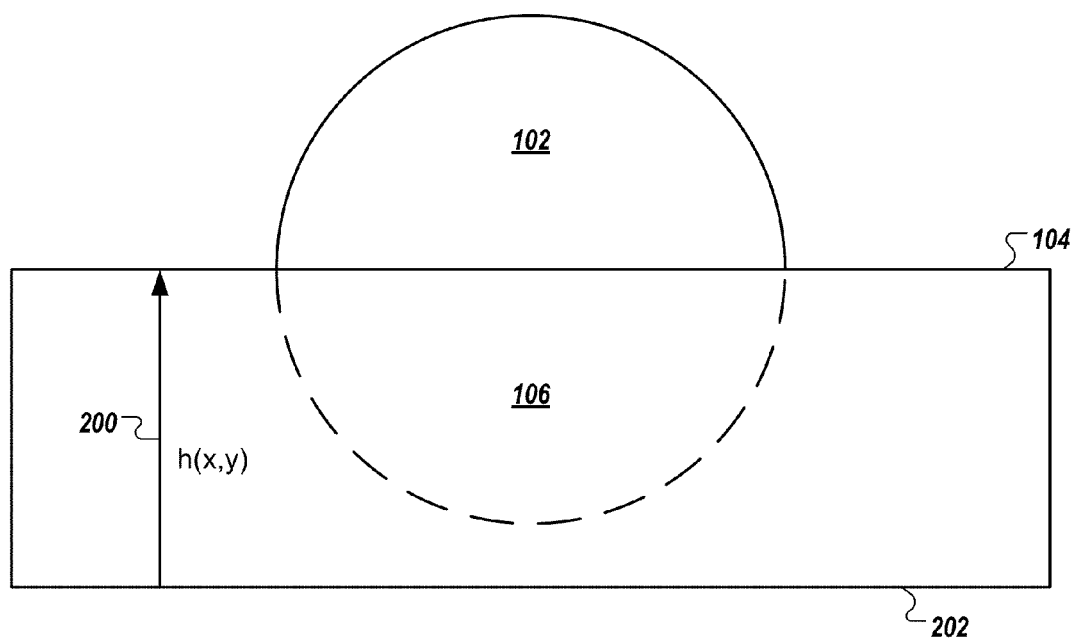
FIG. 2 schematically shows a side view of interference between the ball and the granular material.

FIG. 2 schematically shows a side view of interference 106 between the ball 102 and the granular material. The layer 104 is here defined using a height field which specifies a height 200 for every point (x,y), in the virtual domain. The height 200 can be specified with regard to an arbitrary base level 202 in the virtual domain, such as the plane where z=0 in a three-dimensional Cartesian coordinate system. The height 200 can vary throughout the virtual domain according to how the granular material is presently distributed, and can take the value zero in one or more areas where the granular material is not present. The extent of the interference 106 can be determined by relating the value of the height field at the particular location with the lowest position of the ball at that location. That is, when measuring height upward from the base level 202 at an arbitrary position, the ball has a lower height at that position, which is essentially part of the bottom half of the ball, and an upper height, which is similarly part of the upper half of the ball. From the way the interference 106 is illustrated in this example, it is clear that the difference between the height 200 and the lowest height of the ball at the same location defines the vertical height of the interference 106 there. Thus, the interference 106 can be defined, for the particular ball location of this example, as a set of heights assigned to particular coordinate points in the base level 202. These heights are discrete values assigned to the virtual domain, but as will be described in examples below, the key to eliminating the interference 106 effectively can lie in defining the height values of the interference form as being an approximation of a continuous medium.

Figure 3:
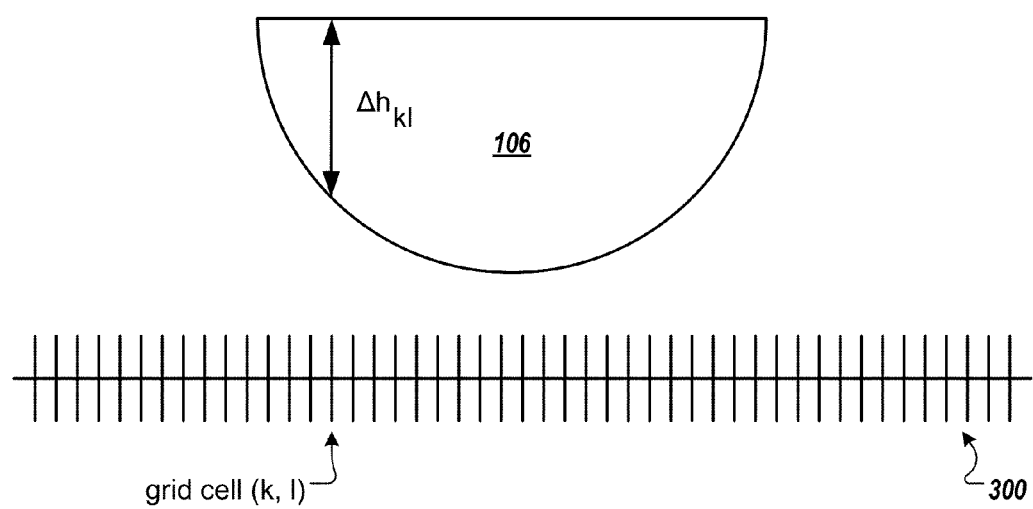
FIG. 3 schematically shows the interference 106 separate from the rest of the layer of the granular material.

FIG. 3 schematically shows the interference 106 separate from the rest of the layer of the granular material. This illustrates two things: first, that this volume of granular material is to be displaced from its current position to accommodate the ball; and second, that the volume forms a closed region that has a definite (although not yet known) volume. For purposes of determining the volume, such that the correct amount of granular material can be distributed elsewhere in the virtual domain, a grid 300 is introduced. That is, the virtual domain 100 (FIG. 1) can be considered an abstract continuous space, and the grid 300 can divide the virtual domain into discrete elements that are either uniform or non-uniform depending on the implementation. For example, the grid 300 can be formed by dividing the base layer 202 (FIG. 2) into segments of equal size (dx,dy), such that one of the heights of the interference 106 is defined for each of the grid cells, including the height zero outside of the interference 106. Thus, in the present example the grid 300 is a uniform grid.

In other implementations, any of multiple non-uniform discretizations can be used including, but not limited to: a rectangle or triangle discretization, a quadtree or octree discretization, or any other adaptive sampling having more samples in certain regions.

The grid cells are here shown as having two dimensions, but can alternatively be defined as three dimensional cells, for example with a height (dz) that is equal to their base dimensions (dx and dy) such that each grid cell forms a cube in the virtual domain. Because the interference 106 represents the amount of granular material that is to be displaced, the interference heights—which are here labeled $\Delta h_{kl}$ for each arbitrary grid cell (k,l)—represent the individual heights of granular material that are to be removed at each of the grid cells to eliminate the interference 106. The heights to be removed ($\Delta h_{kl}$) form a discrete variable with a unit of length. Assume that the heights are now divided with the amount of area of each grid cell:

$$\rho_{kl} = \frac{\Delta h_{kl}}{dx\,dy},$$

where $\rho_{kl}$ is the height to be removed per unit area at the arbitrary grid cell (k,l), and dxdy represents the grid area. The entity $\rho_{kl}$ can therefore be considered a height density, or a height change density, defined in each grid cell of the virtual domain. Because no heights are to be removed from the layer of granular material in any grid cells outside the interference 106 at this stage of the processing, the function $\rho_{kl}$ can there be given the value zero.

The function $\rho_{kl}$ is discrete, meaning that it has a defined value only in each of the finitely sized grid cells. However, with a grid of sufficiently small cells, for purposes of performing the simulation the function $\rho_{kl}$ can be defined as an approximation of a continuous medium that extends throughout the virtual domain. The continuous density of heights to be removed per unit area will here be referred to as $\rho(x,y)$, to indicate that it is defined to have a determinable value for every arbitrary point (x,y) in a coordinate system of real numbers.

Given that the function $\rho(x,y)$ is defined as continuous, certain definitions or choices can be made with regard to it, which will lead to a result particularly well suited for addressing simulations, as will be described in the following. That is, constraints can be placed on the continuous function to ensure that the partial differential equation can be solved numerically. For example, the function can be characterized as defining a scalar field of height densities to be removed. For a scalar field, one can define a vector field $\vec{F}$ such that $$\rho(x, y) = \vec{\Delta} \cdot \vec{F}(x, y),$$

for every point (x,y) in the plane. That is, the entities are defined such that the divergence of the vector field $\vec{F}$ is defined everywhere in the virtual domain, and the field $\vec{F}$ is chosen so that its divergence equals the height density to be removed. The height to be removed can be said to have a flow associated with it, and the vector field $\vec{F}$ represents this flow out from the interference 106. To determine the exact volume of the granular material to be removed from the interference 106, one can integrate the height density throughout the entire virtual domain, which integration due to the relationship with the flow can be expressed as $$\int_\Omega \rho(x, y) dA = \int_\Omega \vec{\Delta} \cdot \vec{F}(x, y) dA, \qquad (1)$$

where $\Omega$ corresponds to the entire virtual domain, and dA represents each infinitely small surface element. Any of multiple different vector fields $\vec{F}$ can satisfy Eq. 1 above. To serve the purposes of creating a well defined formulation for the present calculations, the vector field $\vec{F}$ is here defined to be conservative, so that it can be expressed as the gradient of a scalar potential field $\varphi$:

$$\vec{F}(x, y) = \vec{\Delta}\varphi(x, y), \qquad (2)$$

in every point (x,y). Eqs. 1 and 2 can then be combined into the following partial differential equation:

$$\nabla^2 \varphi(x,y) = \rho(x,y), \qquad (3)$$

known as the Poisson equation, in which $$\nabla^2 = \left( \frac{\partial^2}{\partial x^2} + \frac{\partial^2}{\partial y^2} \right)$$

is the Laplace operator. To find unique solutions to the partial differential equation, boundary conditions should be specified. Here, all grid cells outside the interference 106 are defined as Dirichlet cells for the differential equation and are given the value zero for both the height density field $\rho(x,y)$ and the potential field $\varphi(x,y)$. The height density field $\rho(x,y)$, which is the source term in the Poisson equation, has known nonzero values throughout the interference 106. By solving Eq. 3, therefore, one can find corresponding values for the potential field $\varphi(x,y)$.

Numerical solvers are available that can efficiently solve the Poisson equation and other differential equations. Typically, the solver is implemented as a program that can be executed by a computer based on given input values (for example, the height densities), and that produces a numerical solution to the equation, for example in form of numbers written to a file or otherwise stored in a memory. In various implementations, any numerical solver configured to solve the Poisson equation can be used.

Another advantage of the way the task has been framed above is that the solution to the Poisson equation can be used to determine the heights that are to be removed, or that have been removed, from the interference 106. Namely, the divergence theorem of vector calculus relates the flow of a vector field through a surface to the characteristics of that vector field inside that surface. In other words, the outward flux of a vector field through a closed surface is equal to the volume integral of the divergence of that vector field inside the closed surface. Accordingly, the following equations can be set up:

$$\int_\Omega \rho(x, y) dA = \int_\Omega \vec{\Delta} \cdot \vec{F}(x, y) dA = \int_{\partial\Omega} \vec{\nabla}\varphi(x, y) \cdot d\vec{\Gamma}, \qquad (2)$$

where $\partial\Omega$ denotes any closed region within the domain; for example, $\partial\Omega$ can denote the closed surface of the interference 106. $d\vec{\Gamma}$, in turn, is an infinitely small vector element, for example on the outside of the closed surface. That is, by integrating the gradient of the potential field $\varphi(x,y)$ around the interference 106, one determines the amounts of height that have been, or are to be, removed inside the interference 106. Particularly, if the integration is performed on a cell-by-cell basis in the grid, then the integration result for each grid cell equals the change in the amount of granular material for that grid cell. For example, height is to be removed inside the interference region and height is to be added outside the interference region.

The integration can be performed in any of multiple different ways. One approach is to integrate for all cells in the grid, both inside the interference 106 and elsewhere. This has the advantage that the iterative application of the integration routine does not need to be modified for, or otherwise take into account, the shape or extent of the interference 106; rather, integration can be performed cell-by-cell across the entire domain in a systematic fashion. Of course, for each of the grid cells inside the interference 106, the result of the integration per definition equals the height value $\Delta h_{kl}$. Similarly, the integration result will be zero for every grid cell that does not have any net flow of the vector field $\vec{F}$, and this means every grid cell outside the interference 106 except for those grid cells that abut one or more of the interference cells. For those boundary cells, in contrast, the integration result is key, and that value will be added to the height value of that cell.

Figure 4:
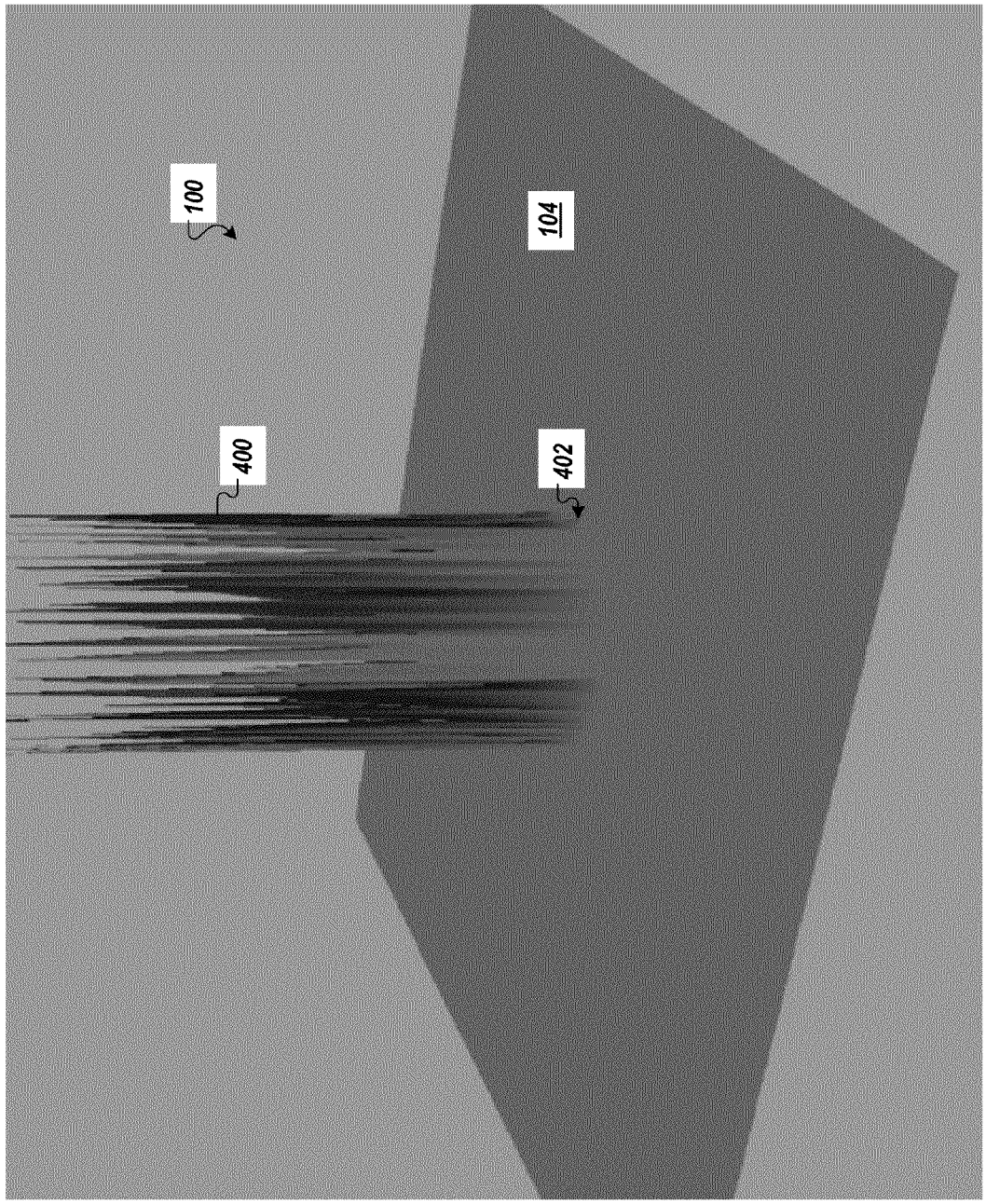
FIG. 4 shows a result of adding height at a boundary of an interference.

FIG. 4 shows a result of adding height 400 at a boundary 402 of an interference. That is, in each grid cell that abuts an interference grid cell, the height to be added, as calculated in the integration, is added to the current height value of that cell. In this example, the layer 104 is relatively smooth and there may accordingly be only a small, or perhaps no, difference in initial height values between the individual boundary cells. In other implementations, the boundary cells can have significantly different initial height values and their calculated additional heights are added to those respective heights. The height removed from the interference is here distributed only along the interference boundary, which is generally not a plausible final location and/or distribution for the displaced granular material. Rather, one or more steps is then performed to create a more realistic shape for the displaced material, for example as described below.

Another approach for integration is to perform the integration only for the boundary cells. In terms of boundaries, the boundaries for the solver can refer to everything in the domain that is not interfering. In contrast, the boundary cells of the object that is placed inside the grid can include all cells on the immediate outside of the closed surface. That is, in such an example the boundary cells would be identified based on the criteria that each one of them is not an interference cell, but that it shares a face with at least one interference cell. The integration can then be constrained so that the integration is performed only for the identified boundary cells. This approach requires the interference shape to be taken into account, but has the advantage that unnecessary integrations are not performed.

The integration for each individual cell can be performed along its border in any of several ways. Because a boundary cell might abut more than one interference cell, the approach of performing the integration along the entire cell boundary has the advantage that no flow will inadvertently be missed in the cell. For any part of the border that does not abut any interference cell, although a flow exists, the net flow will be zero and so it does not contribute to the integration result. As another example, if it is known for the individual cell what part(s) of its border will not contribute to the integration result, the part(s) can be omitted in the integration. For example, the integration for a grid cell with four sides can be performed only on one, two or three of those sides based on whether one, two or three cell borders abut an interference cell.

The heights 400 around the interference can be smoothed to give a more plausible appearance. In some implementations, the difference in height between adjacent cells, which affects the slope of the generated shape, can be taken into account. For example, an iterative approach can be performed where height is displaced from the boundary cells in a direction generally away from the interference. That is, granular material would not be brought back inside the interference to resolve the unnatural appearance of the heights 400. Rather, the heights 400 can be "eroded" using an iterative process such that a plausible shape without extreme features is obtained.

Figure 5:
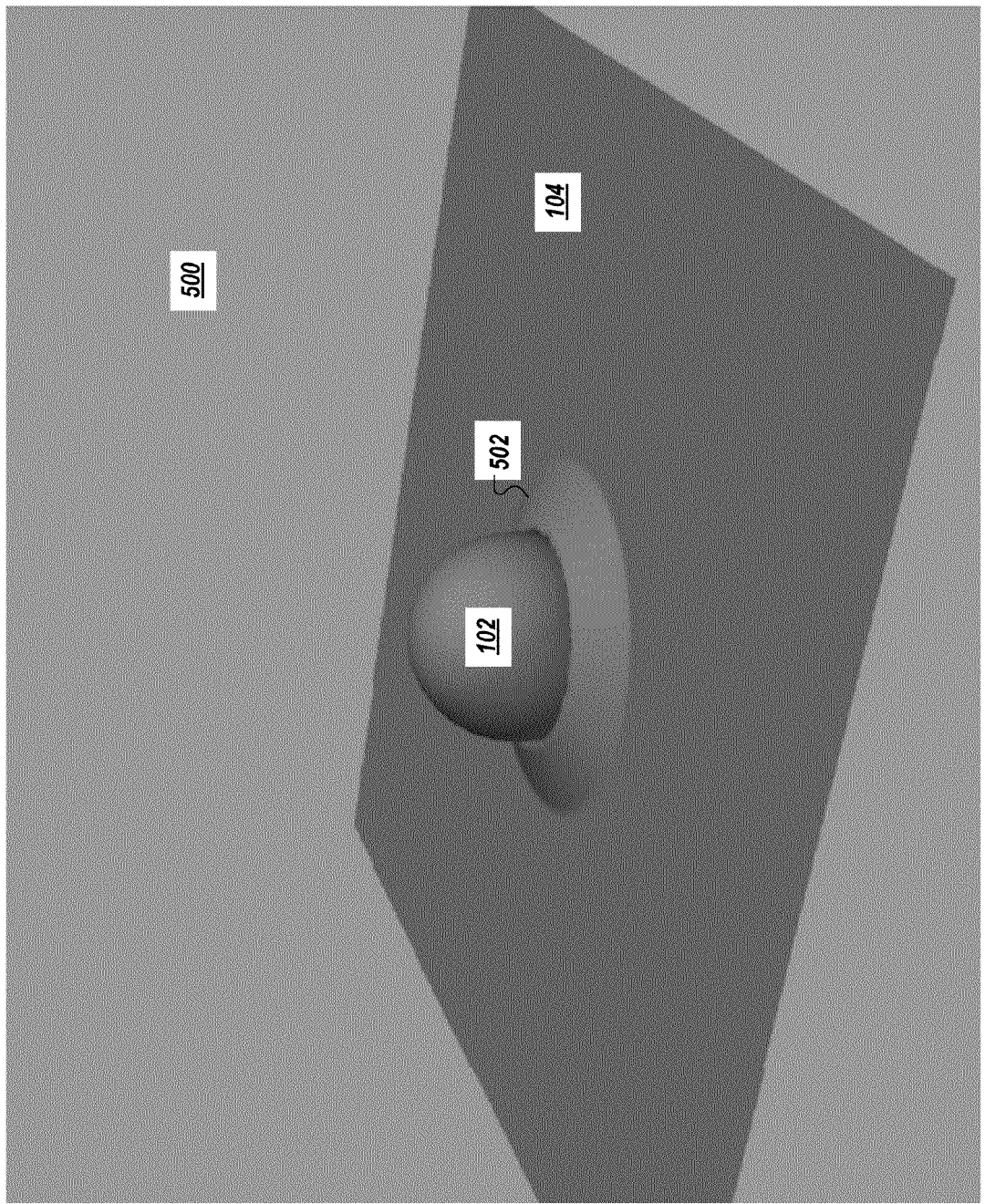
FIG. 5 shows an example of a generated image of the ball and the granular material, with some material displaced to reflect the impact.

FIG. 5 shows an example of a generated image 500 of the ball 102 and the granular material, with some material displaced to reflect the impact. That is, assume that the processing has been performed along the lines as described above, and that the irregularly shaped heights 400 (FIG. 4) have been smoothed or eroded. The layer 104 can then be processed to attain a form as illustrated here, with a shape 502 that surrounds the ball 102. It is noted that the shape 502 in this implementation corresponds to the same amount of granular material that was removed to eliminate the interference, and so no granular material has been lost from, or added to, the virtual domain.

Here, the shape 502 begins at the boundary of what was earlier the interference 106 (FIG. 1), but the interference no longer exists because granular material has been removed from the interference to accommodate the shape of the ball 102. It is seen that the shape 502 gives a plausible appearance to the layer 104 in relation to the impact of the ball 102. The image 500 can be rendered and output in any of multiple ways, for example in form of a still image on a display or in hard copy, or as one frame of a video sequence, for example in a motion picture or a video game.

If the image 500 is part of a sequence of images that are to be assembled as a video sequence, then additional processing can be performed. In some implementations, the granular material can be further manipulated based on the kinetic energy and momentum transferred by the impacting ball. For example, some portion of the granular material that is displaced to eliminate the interference can be animated such that it is thrown from the site of the impact. This can be accomplished using a system designed for particle animation, wherein the particles would represent chunks or grains of the granular material flying through the air and landing on the shape 500, on the surface 104, and/or in any other part of the virtual domain. To preserve the total volume of granular material in the virtual domain, the layer 104 and/or the shape 502 can be modified (e.g., by lowering a height value) to remove an amount of granular material corresponding to any volume added through the particle animation.

Figure 6:
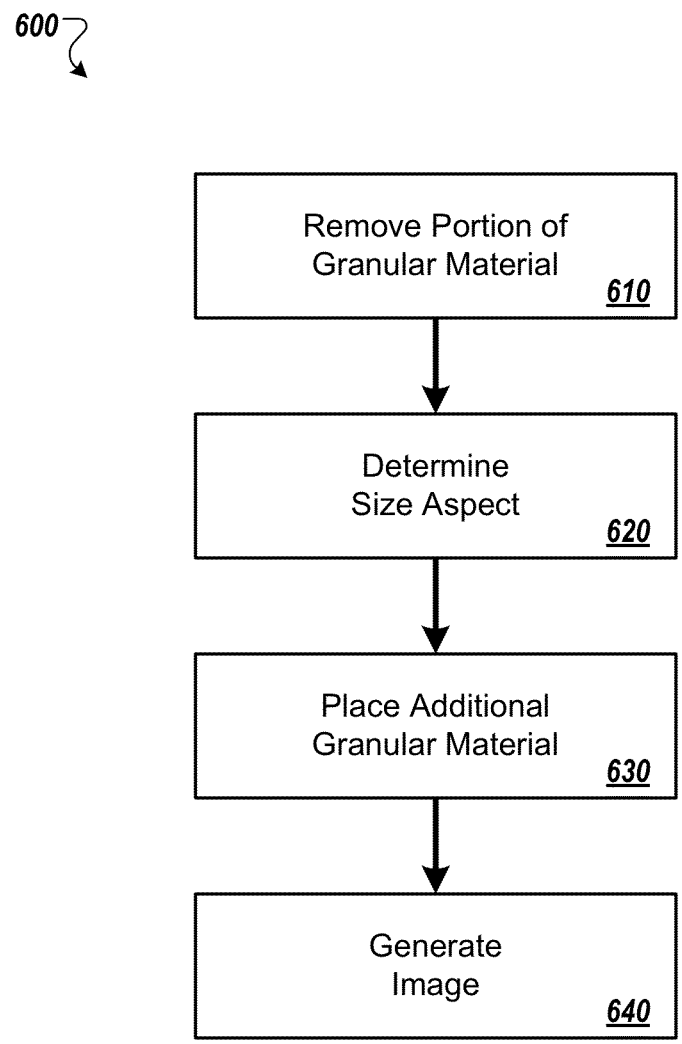
FIG. 6 shows a flowchart of an example method that can be performed.

FIG. 6 shows a flowchart of an example method 600 that can be performed. The method 600 can be performed by a processor executing instructions from a computer readable storage medium. For example, the method 600 can be performed to generate the image 500 (FIG. 5).

Step 610 involves removing a portion of a granular material from a layer of granular material in a virtual domain. The virtual domain is defined by a data structure stored in a computer readable storage medium. The portion of the granular material is removed in a closed region where the portion and a part of an object impacting the granular material are defined as occupying a same space. For example, the granular material in the interference 106 (FIGS. 1, 2, 3) can be removed.

Step 620 involves determining a value for a size aspect of the portion. The value is determined based on applying a numerical solver along an entirety of a boundary of the closed region. For example, the gradient of the divergence of the vector field $F$ can be integrated over at least the grid cells that are at the boundary of the interference 106.

Step 630 involves placing additional granular material along the boundary to create a shape resulting from the impact of the object. For example, the material 502 (FIG. 5) can be placed near the ball 102.

Step 640 involves generating an image using the data structure. The image reflects the impact of the object on the granular material in the virtual domain. For example, the image 500 (FIG. 5) can be generated.

Figure 7:
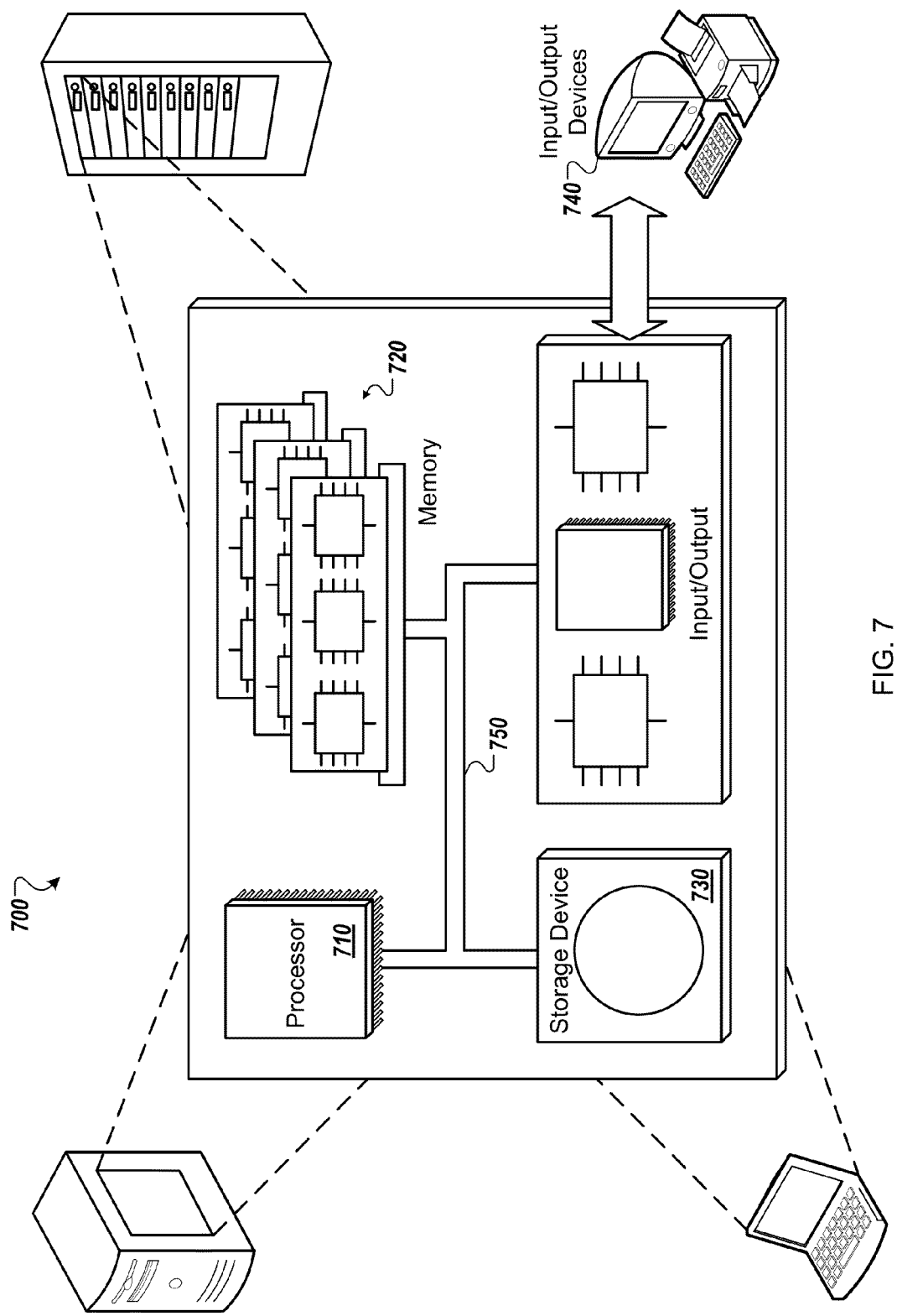
FIG. 7 is a block diagram of a computing system that can be used in connection with computer-implemented methods described in this document.

FIG. 7 is a schematic diagram of a generic computer system 700. The system 700 can be used for the operations described in association with any of the computer-implement methods described previously, according to one implementation. The system 700 includes a processor 710, a memory 720, a storage device 730, and an input/output device 740. Each of the components 710, 720, 730, and 740 are interconnected using a system bus 750. The processor 710 is capable of processing instructions for execution within the system 700. In one implementation, the processor 710 is a single-threaded processor. In another implementation, the processor 710 is a multi-threaded processor. The processor 710 is capable of processing instructions stored in the memory 720 or on the storage device 730 to display graphical information for a user interface on the input/output device 740.

The memory 720 stores information within the system 700. In some implementations, the memory 720 is a computer-readable medium. The memory 720 is a volatile memory unit in some implementations and is a non-volatile memory unit in other implementations.

The storage device 730 is capable of providing mass storage for the system 700. In one implementation, the storage device 730 is a computer-readable medium. In various different implementations, the storage device 730 may be a floppy disk device, a hard disk device, an optical disk device, or a tape device. The input/output device 740 provides input/output operations for the system 700.

In one implementation, the input/output device 740 includes a keyboard and/or pointing device. In another implementation, the input/output device 740 includes a display unit for displaying graphical user interfaces.

The features described can be implemented in digital electronic circuitry, or in computer hardware, firmware, software, or in combinations of them. The apparatus can be implemented in a computer program product tangibly embodied in an information carrier, e.g., in a machine-readable storage device, for execution by a programmable processor; and method steps can be performed by a programmable processor executing a program of instructions to perform functions of the described implementations by operating on input data and generating output. The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a CRT (cathode ray tube) or LCD (liquid crystal display) monitor for displaying information to the user and a keyboard and a pointing device such as a mouse or a trackball by which the user can provide input to the computer.

The features can be implemented in a computer system that includes a back-end component, such as a data server, or that includes a middleware component, such as an application server or an Internet server, or that includes a front-end component, such as a client computer having a graphical user interface or an Internet browser, or any combination of them. The components of the system can be connected by any form or medium of digital data communication such as a communication network. Examples of communication networks include, e.g., a LAN, a WAN, and the computers and networks forming the Internet.

The computer system can include clients and servers. A client and server are generally remote from each other and typically interact through a network, such as the described one. The relationship of client and server arises by virtue of computer programs running on the respective computers and having a client-server relationship to each other.

A number of implementations have been described. Nevertheless, it will be understood that various modifications may be made without departing from the spirit and scope of this disclosure. Accordingly, other implementations are within the scope of the following claims.

What is claimed is:

1. A computer-implemented method for simulating a granular material, the method comprising:
    removing, from a layer of granular material in a virtual domain defined by a data structure stored in a computer readable storage medium, a portion of the granular material in a closed region where the portion and a part of an object impacting the granular material are defined as occupying a same space;
    determining a value for a size aspect of the portion based on applying a numerical solver to a differential equation that relates a first field which is the size aspect per unit area to a second field which is a second derivative of a potential field for the first field;
    placing additional granular material along a boundary of the closed region to create a shape resulting from the impact of the object; and
    generating an image using the data structure, the image reflecting the impact of the object on the granular material in the virtual domain.

2. The computer-implemented method of claim 1, further comprising determining, after placing the additional granular material and before generating the image, whether the additional granular material causes additional interference with the object in the virtual domain, and if so changing a distribution of the additional granular material.

3. The computer-implemented method of claim 2, wherein an iterative process is performed until the additional interference no longer occurs.

4. The computer-implemented method of claim 1, wherein determining the value for the size aspect of the portion involves using discrete height values as an approximation of a continuous medium.

5. The computer-implemented method of claim 4, wherein the size aspect is used to specify a non-zero divergence that the numerical solver takes into account.

6. The computer-implemented method of claim 1, wherein the size aspect includes spatially distributed values representing heights of a height field that are to be removed to accommodate the part of the object, wherein the layer of the granular material is defined by the height field.

7. The computer-implemented method of claim 6, further comprising replacing a specific portion of the granular material defined by the height field with individual particles, wherein the individual particles are visible in the image.

8. The computer-implemented method of claim 1, further comprising setting boundary conditions outside the closed region, wherein the numerical solver uses the boundary conditions in solving the differential equation.

9. The computer-implemented method of claim 1, further comprising defining a grid of grid cells throughout the virtual domain, wherein determining the size aspect includes determining a flow of the size aspect in each of the grid cells that abuts the boundary.

10. The computer-implemented method of claim 9, wherein each grid cell has multiple sides, and wherein in each of the grid cells the flow is determined only for any side of the grid cell that contributes to the flow.

11. The computer-implemented method of claim 1, wherein the granular material is defined in the data structure to represent at least one material selected from: sand, gravel, dirt, snow, hail, slush, earth, dust, debris, ashes, powder, flour, pebbles, saw dust, beads, salt, spice, packing peanuts, marbles, food, tablets, confetti, and combinations thereof.

12. The computer-implemented method of claim 1, further comprising eroding the additional granular material, after placing the additional granular material and before generating the image, in creating the shape.

13. The computer-implemented method of claim 1, wherein the image is one among multiple images generated as part of an animation showing the object in motion while impacting the granular material, wherein in others of the multiple images there are different interferences between the object and the granular material, and wherein different shapes are created in those images to reflect the impact.

14. A computer program product embodied in a non-transitory computer-readable storage medium and comprising instructions that when executed by a processor perform a method for simulating a granular material, the method comprising:
   removing, from a layer of granular material in a virtual domain defined by a data structure stored in a computer readable storage medium, a portion of the granular material in a closed region where the portion and a part of an object impacting the granular material are defined as occupying a same space;
   determining a value for a size aspect of the portion based on applying a numerical solver to a differential equation that relates a first field which is the size aspect per unit area to a second field which is a second derivative of a potential field for the first field;
   placing additional granular material along a boundary of the closed region to create a shape resulting from the impact of the object; and
   generating an image using the data structure, the image reflecting the impact of the object on the granular material in the virtual domain.

15. A computer program product embodied in a non-transitory computer-readable storage medium and comprising instructions that when executed by a processor perform a method for simulating a granular material, the method comprising:
   creating, using a computer system, a data structure that defines a virtual domain in which to perform a simulation, the data structure being stored in a computer readable storage medium;
   defining, in the data structure, a grid for the virtual domain, the grid comprising multiple grid cells;
   defining, in the data structure, a height level field in the virtual domain, the height level field including height values assigned to respective grid cells, each of the height values representing a height of a granular material at one of the grid cells, the height level field being defined such that the granular material forms a surface in at least part of the virtual domain;
   defining, in the data structure, an object in the virtual domain, the object representing a rigid material having an impact on the granular material, the object being positioned in the virtual domain with interference between at least part of the object and the granular material, the interference being that the part of the object is defined as occupying a same space as some of the granular material;
   identifying each one of the grid cells where the object interferes with the granular material, the interference grid cells forming a bounded region in the granular material;
   determining an interference height value for each interference grid cell based on a corresponding overlap between the surface and the object;
   obtaining reduced height values by subtracting each of the interference height values from the height value of the corresponding interference grid cell;
   replacing, in the data structure, the height value for each of the interference grid cells with the corresponding reduced height value, the replacements corresponding to eliminating the interference between the object and the surface by removing an amount of the granular material from the intersection grid cells;
   defining, in the data structure, a source field $\rho$ for the virtual domain that has a source value assigned to each of the grid cells, the source values corresponding to height of the granular material removed per unit area, wherein each source value inside the bounded region is a nonzero value based on the corresponding interference height value, and each source value outside the bounded region is zero;
   determining a potential field $\phi$ for the virtual domain that has a potential value assigned to each of the grid cells, the potential field $\phi$ determined by numerically solving $$\nabla^2 \phi = \rho$$

for each of the grid cells, wherein $\nabla^2$ is the Laplace operator;
   determining a potential gradient $\nabla\phi$ of the potential field $\phi$ for each of the grid cells;
   integrating the potential gradient $\nabla\phi$ over at least each of the grid cells that is a boundary grid cell to obtain a distribution height value for each of the boundary grid cells, wherein each of the boundary grid cells (i) is a non-interference grid cell, and (ii) abuts at least one of the interference grid cells;
   adding, in the data structure, each distribution height value to the height value of the corresponding boundary grid cell, the addition corresponding to distributing additional granular material among all of the boundary grid cells, the additional granular material being equal in volume to the amount of the granular material removed from the interference grid cells;
   redistributing some of the additional granular material from the boundary grid cells to other non-interference grid cells by adjusting the height values in the data structure accordingly, the redistribution corresponding to creating a shape of the granular material resulting from the impact of the object;
   generating an image using the data structure, the image reflecting the impact of the object on the granular material in the virtual domain; and
   displaying the image.

16. The computer-implemented method of claim 1, further comprising:
   defining a grid for the virtual domain, the grid comprising multiple grid cells;
   defining a height level field in the virtual domain, the height level field including height values assigned to respective grid cells, each of the height values representing a height of the granular material at one of the grid cells, the height level field being defined such that the granular material forms a surface in at least part of the virtual domain; and identifying each one of the grid cells where the object interferes with the granular material, the interference grid cells forming the closed region in the granular material, wherein the numerical solver is applied along an entirety of the closed region.

17. The computer-implemented method of claim 16, further comprising:

defining the first field as a source field $\rho$ for the virtual domain that has a source value assigned to each of the grid cells, the source values corresponding to height of the granular material removed per unit area, wherein each source value inside the closed region is a nonzero value based on a corresponding interference height value, and each source value outside the closed region is zero; and determining the second field as a potential field $\phi$ for the virtual domain that has a potential value assigned to each of the grid cells, wherein the differential equation is $\nabla^2 \phi = \rho$, with $\nabla^2$ being the Laplace operator.

18. The computer-implemented method of claim 17, further comprising:

determining a potential gradient $\nabla \phi$ of the potential field $\phi$ for each of the grid cells; and integrating the potential gradient $\nabla \phi$ over at least each of the grid cells that is a boundary grid cell to obtain a distribution height value for each of the boundary grid cells, wherein each of the boundary grid cells (i) is a non-interference grid cell, and (ii) abuts at least one of the interference grid cells.

19. The computer-implemented method of claim 18, further comprising:

adding each distribution height value to the height value of the corresponding boundary grid cell, the addition corresponding to distributing the additional granular material among all of the boundary grid cells, the additional granular material being equal in volume to the amount of the removed portion of the granular material.

* * * * *